(12) United States Patent  (10) Patent No.: US 7,749,324 B2
Yoshihara et al.  (45) Date of Patent: Jul. 6, 2010

(54) CASTING METHOD OF SILICON INGOT AND CUTTING METHOD OF THE SAME

(75) Inventors: Mitsuo Yoshihara, Kainan (JP); Kenichi Sasatani, Kainan (JP)

(73) Assignee: Sumco Solar Corporation, Wakayama (JP)

(*) Notice: Subject to any disclaimer, the term of this patent is extended or adjusted under 35 U.S.C. 154(b) by 93 days.

(21) Appl. No.: 12/003,343

(22) Filed: Dec. 21, 2007

(65) Prior Publication Data

US 2008/0179037 A1   Jul. 31, 2008

(30) Foreign Application Priority Data

Dec. 25, 2006  (JP)  ............... 2006-347348

(51) Int. Cl.
*C30B 15/00* (2006.01)
*C30B 21/04* (2006.01)
*C30B 9/00* (2006.01)

(52) U.S. Cl. .............. 117/18; 117/30; 117/50; 117/81; 117/917

(58) Field of Classification Search ............ 117/18, 117/30, 32, 34, 49, 50, 51, 81–87, 917; 164/503; 257/E27.124, E27.125
See application file for complete search history.

(56) References Cited

U.S. PATENT DOCUMENTS

| 2,961,305 | A | * | 11/1960 | Dash | ............... 117/34 |
|---|---|---|---|---|---|
| 3,135,585 | A | * | 6/1964 | Dash | ............... 117/34 |
| 4,769,107 | A | * | 9/1988 | Helmreich et al. | ............... 117/81 |
| 4,915,723 | A | * | 4/1990 | Kaneko et al. | ............... 65/144 |
| 5,268,063 | A | * | 12/1993 | Kaneko et al. | ............... 117/32 |
| 6,027,563 | A | * | 2/2000 | Choudhury et al. | ............... 117/18 |
| 6,136,091 | A | * | 10/2000 | Yamazaki et al. | ............... 117/81 |
| 6,695,035 | B2 | * | 2/2004 | Kimura et al. | ............... 164/507 |
| 6,994,835 | B2 | * | 2/2006 | Sasatani et al. | ............... 423/348 |
| 7,110,430 | B2 | * | 9/2006 | Lazor | ............... 373/144 |
| 7,113,535 | B2 | * | 9/2006 | Tenzek et al. | ............... 373/151 |
| 7,141,114 | B2 | * | 11/2006 | Spangler et al. | ............... 117/81 |
| 7,591,712 | B2 | * | 9/2009 | Morikawa et al. | ............... 451/36 |
| 2006/0000409 | A1 | * | 1/2006 | Spangler et al. | ............... 117/81 |
| 2007/0039544 | A1 | * | 2/2007 | Kaneko | ............... 117/81 |
| 2007/0169684 | A1 | * | 7/2007 | Stoddard | ............... 117/13 |

(Continued)

FOREIGN PATENT DOCUMENTS

JP   2-51493   2/1990

(Continued)

*Primary Examiner*—G. Nagesh Rao
(74) *Attorney, Agent, or Firm*—Clark & Brody (57) ABSTRACT

The present invention includes a method for casting a silicon ingot by using a continuous casting method by means of an electromagnetic induction, and a method for cutting the silicon ingot as a starting material into plural silicon blocks. When the silicon blocks with a square section are cut out, the sectional shape of the silicon ingot is set to be rectangular. Not less than 6 pieces of equal-sized silicon blocks are cut out from the silicon ingot, thereby enabling to enhance the manufacturing efficiency to a great extent. And since the amount of excision of the edge per silicon block is reduced, the production yield can be enhanced. Further, since the proportion of columnar crystals with large grain size inside the ingot can be increased, it becomes possible to enhance the conversion efficiency of a solar battery using the silicon block as a substrate material.

6 Claims, 8 Drawing Sheets

U.S. PATENT DOCUMENTS

2007/0169685 A1* 7/2007 Stoddard .................... 117/13
2008/0179037 A1* 7/2008 Yoshihara et al. ........... 164/460
2008/0210156 A1* 9/2008 Sasatani et al. .............. 117/81
2008/0223351 A1* 9/2008 Morikawa et al. ............. 125/1

FOREIGN PATENT DOCUMENTS

WO    WO 2006120736 A1 * 11/2006

* cited by examiner

Casting direction

Casting direction

FIG.6B

Casting direction

CASTING METHOD OF SILICON INGOT AND CUTTING METHOD OF THE SAME

BACKGROUND OF THE INVENTION

1. Field of the Invention

The present invention relates to a casting method of a silicon ingot and a cutting method of the same, more specifically to the casting method and cutting method of the silicon ingot that enhance the manufacturing efficiency, production yield of the silicon ingot and conversion efficiency of a solar battery using a silicon block cut out from the silicon ingot as a substrate material.

2. Description of the Related Art

The majority of solar batteries manufactured these days use silicon crystals as substrate materials for them. The silicon crystal is classified into a monocrystal and a polycrystal. Generally, the solar battery having a high efficiency of energy conversion from incident light energy into electric energy can be obtained by using the monocrystal as the substrate.

Since a high-quality dislocation-free crystal is required for manufacturing a monocrystal silicon, the Czochralski method that pulls up and grows the monocrystal from molten silicon is applied for the production. However, the monocrystal silicon grown by the Czochralski method increases the manufacturing cost compared to the polycrystal silicon described later, which is disadvantageous. Accordingly, using the monocrystal silicon as the substrate of the solar battery will increase the manufacturing cost of the solar battery, which is of an issue.

On the other hand, the polycrystal silicon is generally manufactured by a casting method that solidifies the molten silicon with a mold (hereinafter referred to as 'casting method'), or a continuous casting method by electromagnetic induction (hereinafter referred to as 'electromagnetic casting method'). This casting method or the electromagnetic casting method is capable of manufacturing a substrate material at a lower cost than the monocrystal silicon substrate manufactured by the Czochralski method.

In casting the polycrystal silicon by the casting method, a high-purity silicon as a raw material is heated and melted inside a crucible, and a trace amount of boron etc. as a doping material is uniformly added, and thereafter the molten metal is solidified inside the crucible or poured into the mold to be solidified therein. Generally, a silicon block is a square, from which the substrate used for the solar battery is sliced. Accordingly, in case of solidifying the molten metal as it is after melting, a square quartz crucible is used; and in case of pouring the molten metal into the mold, a square graphite mold is used.

Applying a one-directional solidification method to this casting method makes it possible to obtain a polycrystal silicon of a large crystal grain. However, since the casting method is an ingot making method that solidifies the molten silicon with the mold, there arise various problems. Contacting the molten silicon with a vessel wall, for example, might cause an impurity contamination. Further, a mold lubricant used for preventing seizure of an ingot with the mold might be mixed into the molten silicon.

As mentioned above, the casting method requires using high-purity materials for the quartz crucible and the graphite mold etc. as well as replacing these periodically, which leads to an increase of the manufacturing cost. Further, the casting method is the ingot making method and has difficulties in casting continuously, which will incur a decrease in the manufacturing efficiency.

As a method for solving these problems, an electromagnetic casting method is developed, which is capable of casting the silicon crystal in such a manner that the molten silicon does not substantially come into contact with the crucible and the mold.

The electromagnetic casting method uses an apparatus where parts each in a strip shape, made of materials with high electrical conductivity and thermal conductivity, electrically insulated to each other in a circumferential direction, and water-cooled inside thereof, are disposed inside a high-frequency induction coil. In regard to the cross-sectional shape of the coil and a body enclosed with the strip-formed elements constituting the crucible, both a circular cylindrical shape and a rectangular cylindrical shape are applicable.

Since each of the strip-formed elements constituting the cooling copper crucible is electrically separated from each other, when a raw material silicon is charged into the cooling copper crucible as a melting vessel and an alternate current is applied to the high-frequency induction coil, a current loop is generated inside each element. Since the current on the side surface of an inner wall of the cooling crucible forms a magnetic field inside the crucible, the silicon inside the crucible can be heated and melted. The silicon inside the crucible receives force (pinch force) inwardly in a direction normal to the surface of the molten silicon by the interaction between a magnetic field formed by the current on the inner wall of the cool crucible and a skin current of the molten silicon; thereby, the silicon is melted in a non-contact state relative to the crucible.

The electromagnetic casting method uses the water-cooling copper crucible having been used for melting also for solidification. Specifically, moving downward a supporting base that holds the molten silicon and the ingot on its lower part while melting the silicon inside the crucible will decrease an induced magnetic field, as the supporting base moves away from the lower end of the high-frequency induction coil; therefore, a calorific value and the pinch force attenuate, and further the cooling by the water-cooling copper crucible will progress the solidification from an outer circumferential portion of the molten silicon. By continuously inputting the raw material from the upper part of the crucible to continue the melting and solidification according to the downward movement of the supporting base, the polycrystal silicon can be continuously cast while solidifying from the lower part of the water-cooling copper crucible, without contacting the molten silicon with the wall of the crucible.

As mentioned above, the electromagnetic casting method has advantages that: the molten silicon hardly comes into contact with the crucible; the use of the high-purity material for the crucible is not necessary; and the cooling area is wide to thereby make it possible to increase the casting speed. From the viewpoint of these advantages, various examinations have been made for enhancing the quality of the solar battery using the polycrystal silicon as the substrate material as well as for lowering the manufacturing cost.

The Japanese Patent Application Publication No. 2-51493 discloses an apparatus by the electromagnetic casting method using the above cooling crucible, comprising the construction of filling a closed vessel with an inert atmosphere pressured slightly higher than the atmospheric pressure, continuously pulling out a continuously cast ingot by providing a substantially non-contact seal on the lower part of the closed vessel, and mechanically cutting the ingot at a position exited from the closed vessel. Thereby, although the conventional method has been restricted by the capacity of an electromagnetic casting furnace and the casting could be performed only intermittently until now, it becomes possible to continuously produce the silicon ingot.

Besides, various examinations have been made not only for the continuous casting process but also for the process of manufacturing silicon blocks from a cast ingot, in order to enhance the quality of the solar battery and reducing the manufacturing cost.

Figure 1:
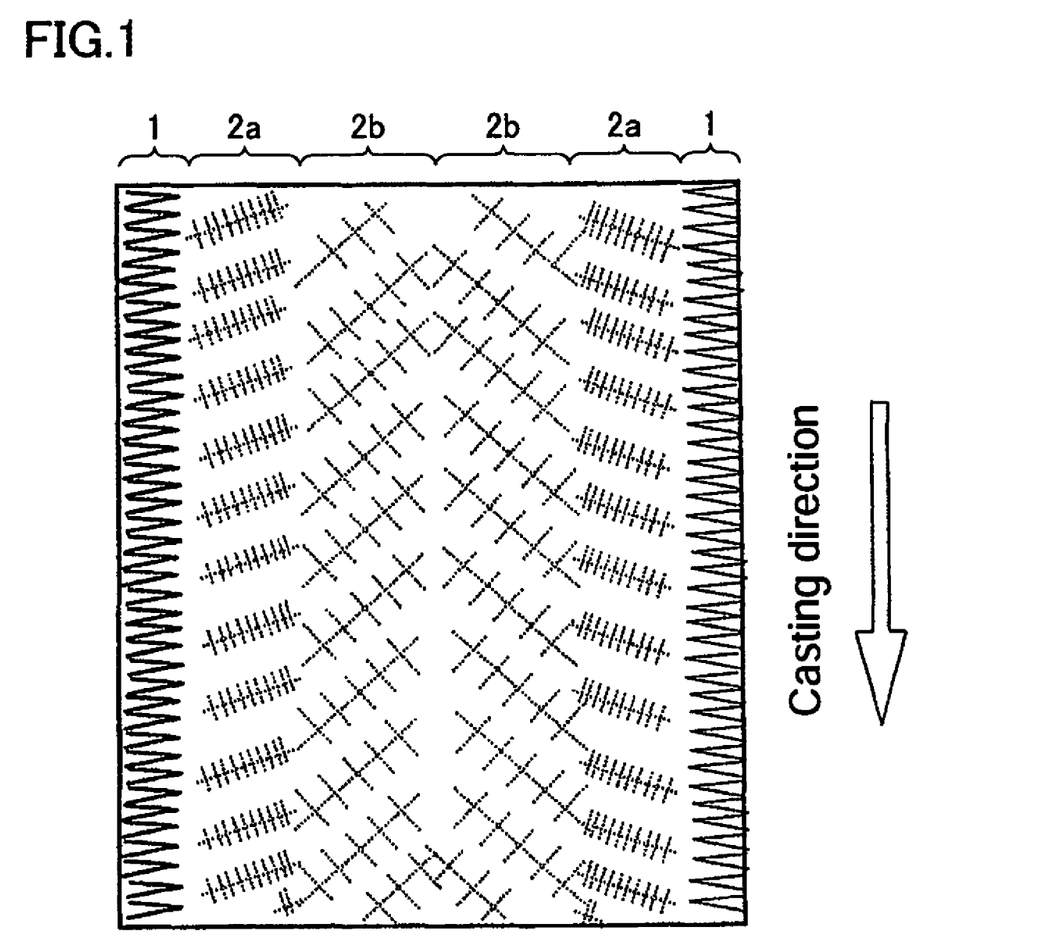
FIG. 1 is a view typically showing a crystallized pattern of a longitudinal section of an ingot cast by using an electromagnetic casting method.

FIG. 1 typically shows a crystallized pattern of a longitudinal section of an ingot cast by using an electromagnetic casting method. As shown in FIG. 1, in the crystallized pattern of the longitudinal section of the ingot, a chill layer 1 of a fine crystal grain size grows from a side surface of the ingot in a direction perpendicular to the side surface, and columnar crystals 2a, 2b grow to thicken toward the upper heat source, exhibiting much conspicuous tendency at the inner portion thereof.

The inside of the ingot containing the columnar crystals 2a, 2b with a larger crystal grain size grown has an excellent semiconductor characteristic; however, since the chill layer 1 has a smaller grain size and has abundant crystal defects, the semiconductor characteristic thereof cannot be said excellent. Accordingly, it is necessary to excise a certain portion with a certain thickness (hereinafter also referred to as 'edge') from the side surface of the ingot for removing the chill layer 1. Generally, the above excision of the edge is executed in cutting out the silicon blocks from the ingot.

Figure 2A:
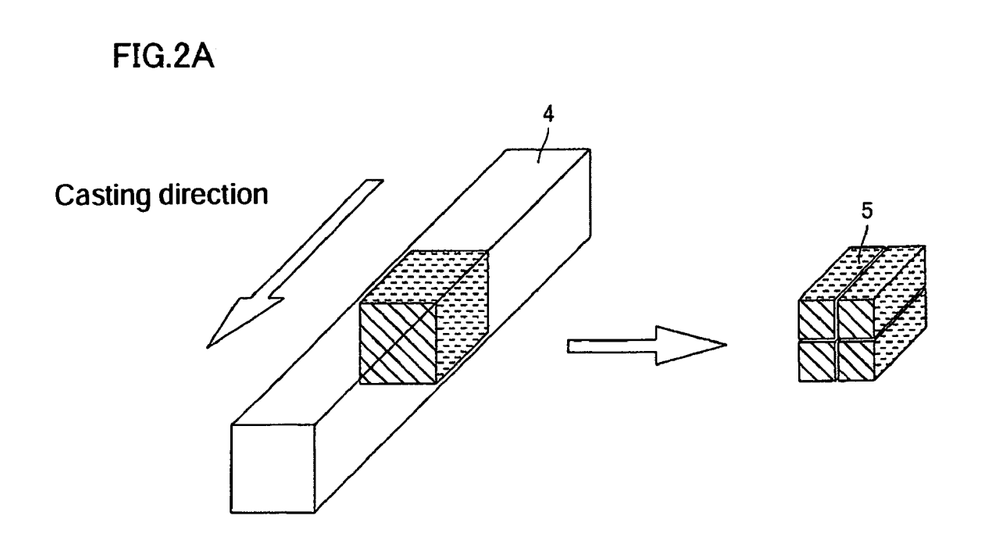
FIG. 2A is a conceptual view showing the directions in cutting out a silicon block.
Figure 2B:
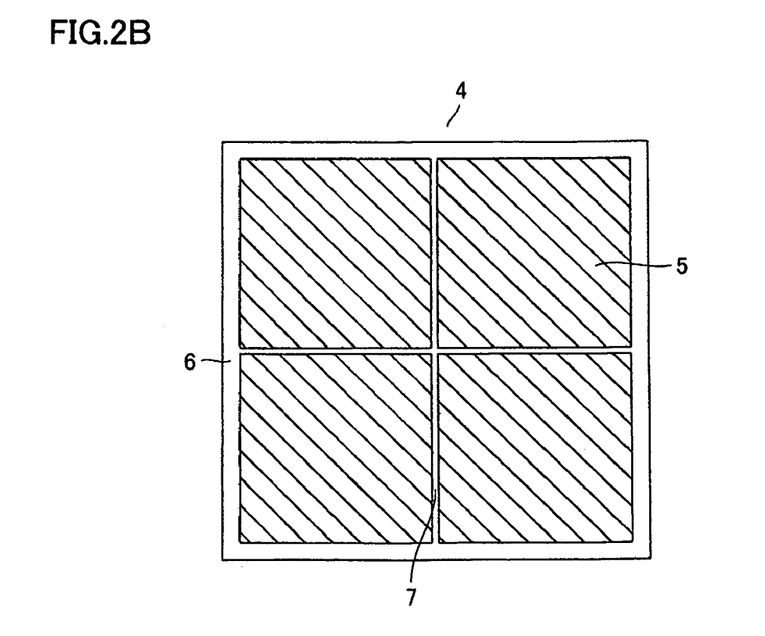
FIG. 2B is a sectional view of the silicon ingot.

FIGS. 2A and 2B typically explain a conventional method of cutting out silicon blocks from a silicon ingot, in which FIG. 2A is a conceptual view showing the direction of cutting out the silicon blocks, and FIG. 2B is a sectional view of the silicon ingot. As shown in FIG. 2A, since the substrate of a solar battery assumes a square, the conventional manufacturing method of the silicon blocks adopts a method for cutting out four pieces of silicon blocks 5 with a square section from an ingot 4 cast in a square sectional shape.

As shown in FIG. 2B, after an edge 6 forming the chill layer on the side surface is excised, the ingot 4 is cut and divided into four pieces of the silicon blocks 5 along a cutting margin 7. Thus, excising the edge 6 will produce the silicon blocks having a large crystal grain size and excellent semiconductor characteristics with few crystal defects.

As mentioned above, in the cutting method of the silicon ingot using the conventional electromagnetic casting method, a reasonable method for preventing the production yield from lowering is applied in consideration of the aspect that the substrate of the solar battery is used in a square shape.

SUMMARY OF THE INVENTION

The electromagnetic casting method excels the casting method in the following points that: the above molten silicon does not come into contact with the crucible; it is not necessary to use the high-purity material for the crucible; and the manufacturing efficiency thereof is high. However, the electromagnetic casting method is demanded to further enhance the manufacturing efficiency of the silicon ingot and the production yield in order to further reduce the manufacturing cost of the solar battery.

For dramatically enhancing the manufacturing efficiency of the silicon ingot, it is conceivable to enhance the cooling capacity of the water-cooling copper crucible and increase the casting speed by accelerating the solidification. However, as to the acceleration of solidification by enhancing the cooling capacity, there are concerns about the accumulation of stresses due to a great temperature gradient generated in a cast ingot, and the generation of cracks accompanied therewith.

It is also conceivable to enhance the manufacturing efficiency by analogously increasing the sectional area of the ingot and increasing the amount of casting per unit time. However, if this method is used, it will increase the distance from the center of the ingot to the side thereof, therefore, it takes a long time until the molten silicon completely solidifies, which increases the depth of an interface of solid and liquid phases.

Figure 3:
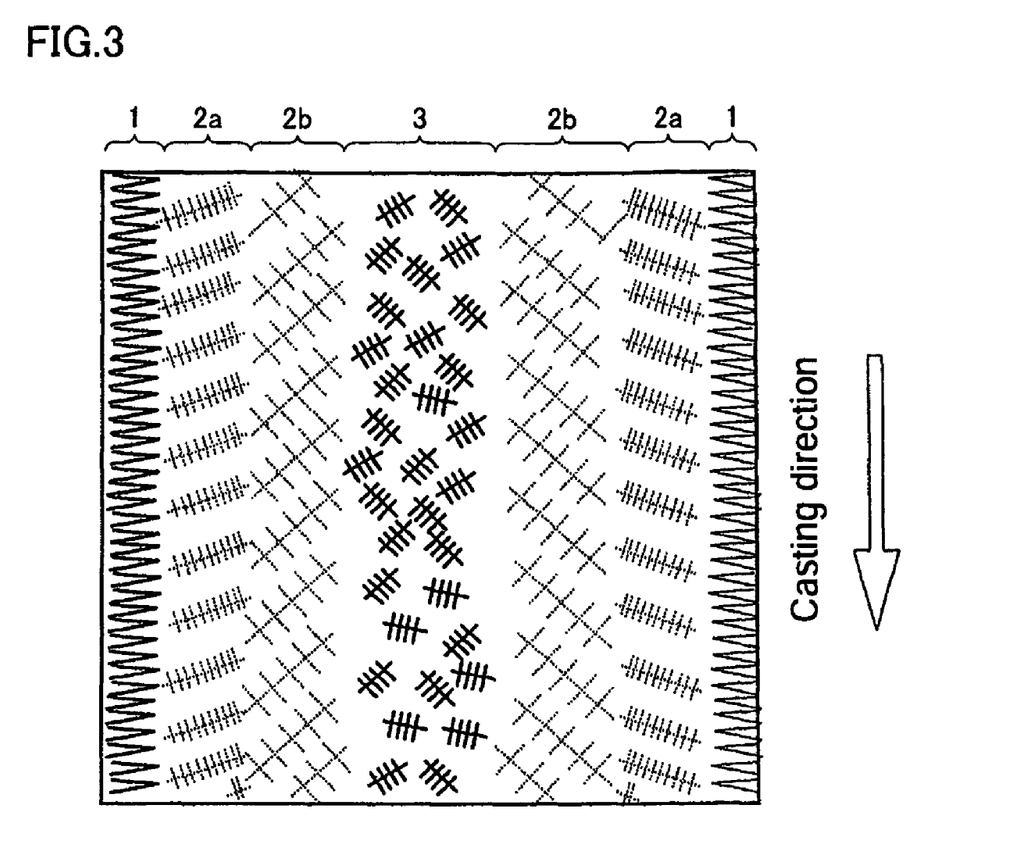
FIG. 3 is a view typically showing a crystal growth pattern of a longitudinal section of an ingot, which is cast by using an electromagnetic casting method and by increasing a distance from the center of the ingot to a side thereof.

FIG. 3 typically shows a crystal growth pattern of a longitudinal section of an ingot, which is cast by using the electromagnetic casting method and by increasing the distance from the center of the ingot to the side thereof. As shown in FIG. 3, if the interface of solid and liquid phases becomes deep by increasing the distance from the center of the ingot to the side thereof, it will lack the heat supply from the melting coil; and this lack of heat supply generates equi-axial crystals 3 having a small crystal grain size near the center. Since the generated area of the equi-axial crystals 3 includes a lot of crystal grain boundaries, the semiconductor characteristic in this area cannot be said excellent. Accordingly, it becomes necessary to lower the casting speed so as not to make the interface of solid and liquid phases deep, in order to avoid a deterioration of the quality.

On the other hand, for enhancing the production yield, it is conceivable to reduce the excision amount of the edge; however, the amount of excision of the edge should be determined in consideration of the balance of the production yield and the quality. If the amount of excision is reduced in consideration of the production yield only, the deterioration of quality of the solar battery cannot be avoided.

The present invention has been made in view of the above problems, and an object of the present invention is to provide a casting method of a silicon ingot that enhances the manufacturing efficiency and production yield of the silicon ingot as well as obtains a solar battery having high conversion efficiency, and a cutting method of the same.

In order to solve the above problems, the inventors of the present invention reviewed all the steps from the casting of an ingot by the electromagnetic casting method to the cutting-out of silicon blocks, and performed various examinations. As the results of those, the inventors have found that the electromagnetic casting can be carried out at substantially the same casting speed as that of the case with the conventional sectional area, even when the sectional area of a cast ingot is increased in order to increase the mass of the cast ingot per unit length.

The inventors have also paid attention to that increasing the sectional area of an ingot as well as increasing the number of silicon blocks to be cut-out in a vertical or transverse direction will decrease the amount of excision of the edge per one silicon block, in comparison to the conventional method of cutting out four pieces of silicon blocks from an ingot of a square section.

Further, the inventors have found that increasing the sectional area of a cast ingot as well as making the sectional shape rectangular will reduce the influence of solidification from the side in a major side direction and increase the rate of columnar crystals having a large grain size in the ingot.

The present invention is completed based on the above findings, and the gist thereof pertains to (1) casting method of a silicon ingot, and (2) and (3) cutting method of a silicon ingot, as below.

(1) A method for casting a silicon ingot from which silicon blocks with a square sectional shape are cut out thereafter, using a continuous casting method by an electromagnetic induction, the method being characterized in that a sectional shape of the silicon ingot is rectangular, which excels in a manufacturing efficiency.

(2) A method for cutting out silicon blocks with a square sectional shape from a cast silicon ingot, using a continuous casting method by an electromagnetic induction, where a sectional shape of the silicon ingot is rectangular, and the cutting method of the silicon ingot that enables to cut out not less than six pieces of equal-sized silicon blocks, while bisecting the minor sides of the rectangle, from the silicon ingot.

(3) The cutting method of the silicon ingot described in the above (2) is capable of enhancing the conversion efficiency of a solar battery, by using said cut-out silicon block for a substrate material for a solar battery, which is desirable.

The 'silicon block' in the present invention signifies a lump of silicon in a rectangular block shape with a square section, being cut out from a silicon ingot as a starting material to be cut thereafter. The dimension of the square section of this silicon block is determined by the customers' needs of a solar battery substrate as a product. Recently, the size tends to become larger, and a side length is generally 150~160 mm. To slice the silicon block in parallel to the sides of the square section thereof by the thickness of about 200 μm will produce a substrate used for the solar battery.

And, 'excels in the manufacturing efficiency' means that the amount of casting per unit time can be increased in comparison to the conventional electromagnetic casting method.

According to the casting method of a silicon ingot in the present invention, in comparison to the conventional casting method of a silicon ingot, it becomes possible to enhance the manufacturing efficiency to a large extent, because of manufacturing the ingot with an increased sectional area while maintaining an equal casting speed.

According to the cutting method of a silicon ingot in the present invention, the sectional area of the ingot is increased, and the number of silicon blocks to be cut out is increased, whereby the amount of excision of the edge per silicon block is decreased; therefore, the production yield can be enhanced.

Further, the sectional shape of the cast ingot is made rectangular, and the sectional area is increased, whereby the rate of columnar crystals with a large grain size inside the ingot is increased; therefore, the conversion efficiency of the solar battery using a silicon block thus cut-out as the substrate material can be enhanced.

BRIEF DESCRIPTION OF THE DRAWINGS

FIGS. 2A and 2B are views typically explaining a conventional method of cutting out a silicon block from a silicon ingot.

FIGS. 6A and 6B are views typically explaining a method for cutting out a silicon block from a cast silicon ingot by a casting method of the present invention.

FIGS. 8A and 8B are views typically showing a method for cutting out equal-sized silicon blocks from a silicon ingot of a rectangular section.

DETAILED DESCRIPTION OF THE PREFERRED EMBODIMENTS

Figure 4:
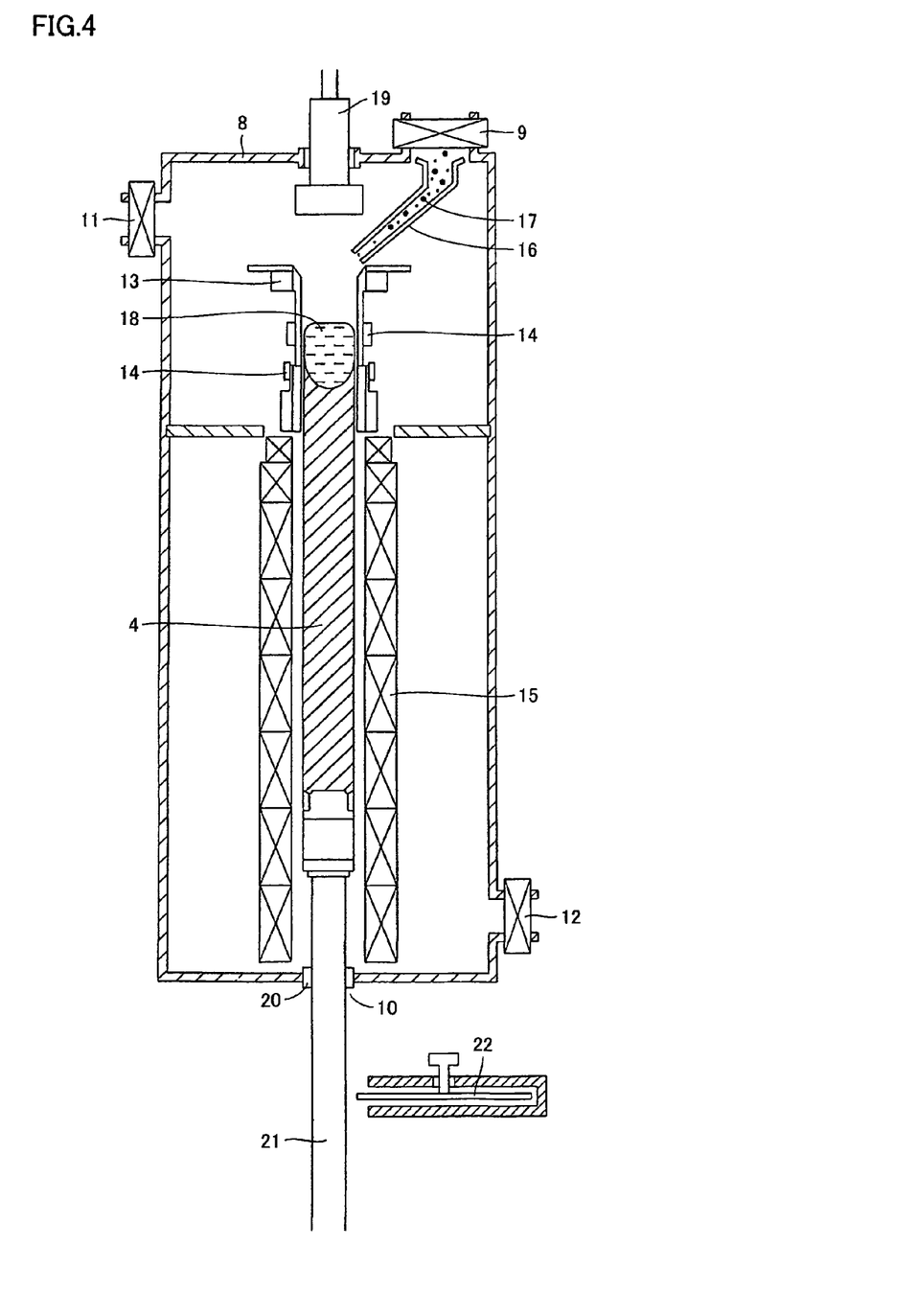
FIG. 4 is a view typically showing one example of an electromagnetic casting furnace for casting a silicon ingot, which is used in the present invention.
Figure 5:
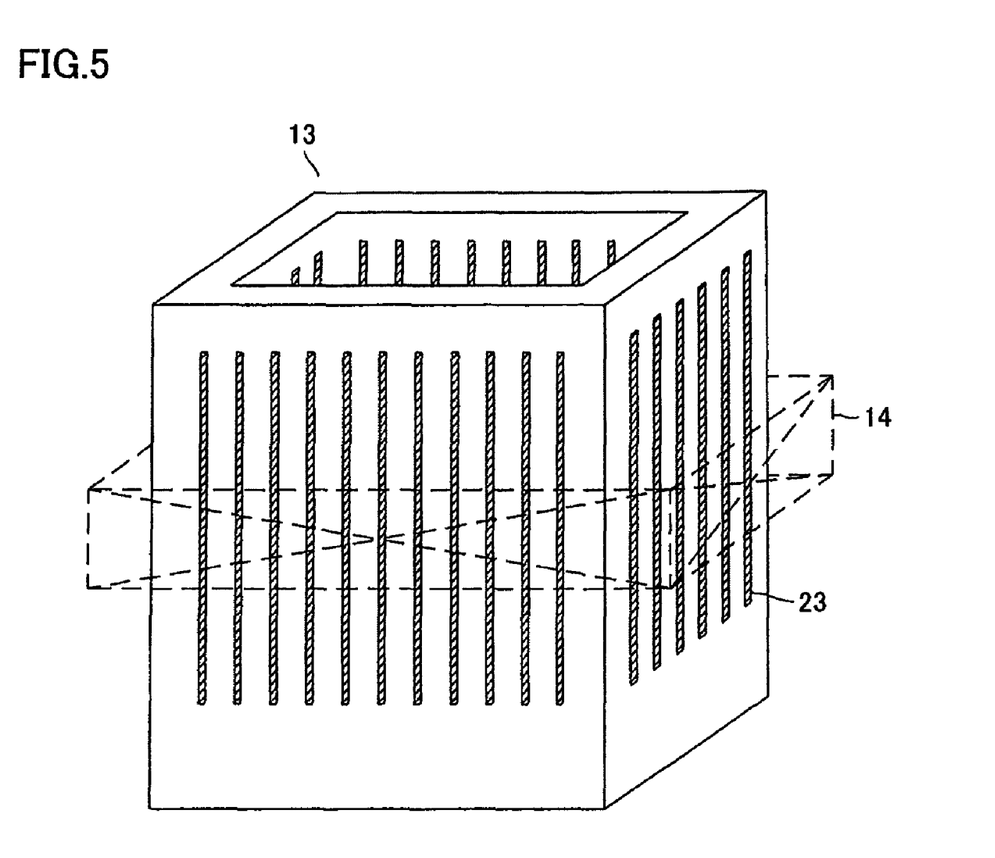
FIG. 5 is a perspective view typically showing one example of a cooling crucible in a rectangular sectional shape, which is used in the present invention.

FIG. 4 typically shows one example of an electromagnetic casting furnace for casting a silicon ingot, which is used in the present invention. FIG. 5 is a perspective view typically showing one example of a cooling crucible in a rectangular sectional shape, which is used in the present invention. A chamber 8 is a water-cooling vessel with a double wall structure so as to be protected from inner heat generation, and is coupled with a raw material charging apparatus on the top thereof, which is partitioned by a decoupling means 9. The chamber 8 has an outlet 10 for pulling out the ingot at the bottom thereof. The chamber 8 is provided with an inert gas inlet 11 on the upper sidewall thereof, and a vacuum suction port 12 on the lower sidewall thereof.

In the center of the chamber 8 is provided with a cooling crucible 13, an induction coil 14, and an after-heater 15 as an electromagnetic casting means. The cooling crucible 13 with a water-cooling rectangular-cylinder body made of copper is circumferentially, partially divided into plural segments by partial longitudinal slits 23. The induction coil 14 is mounted on the outer circumferential side of the cool crucible 13, so as to have the same center axis, where the slits 23 are disposed, and is connected to a power supply by a coaxial cable not shown. The after-heater 15 is installed so as to be coaxial, in succession below the cooling crucible 13. The after-heater 15 heats the ingot 4 pulled down from the cooling crucible 13, and gives a predetermined temperature gradient to the ingot 4 in an axial direction thereof.

A raw material supply pipe 16 is placed below the decoupling means 9 provided inside the chamber 8. A granular and lump raw material silicon 17 charged into the raw material supply pipe 16 is supplied to a molten silicon 18 inside the cooling crucible 13. An auxiliary heater 19 made of graphite and so forth is installed right on the top of the cooling crucible 13, being capable of moving up and down. The auxiliary heater 19 is inserted into the cooling crucible 13 while in a moving down mode.

A gas seal 20 is provided at the lower part of the after-heater 15, and a withdrawing equipment 21 that pulls out the ingot 4 while supporting it is also provided at the lower part of the after-heater 15. A diamond cutting machine 22 as a mechanical cutting means is provided outside the chamber 8 below the gas seal 20. The diamond cutting machine 22 is configured to descend in a manner synchronizing a withdrawing speed of the silicon ingot 4. The diamond cutting machine 22, while moving so as to follow the movement of the withdrawn ingot 4, cuts the ingot 4 being withdrawn out of the chamber 8 from the outlet 10. By repeating these operations, a desired silicon ingot is cast semi-continuously.

The casting method of a silicon ingot in the present invention is characterized in that the sectional shape of the ingot is rectangular, compared with the conventional method of casting an ingot with a square section. According to the present invention, the minor side of the rectangle can be set to have the same length as a side length of the conventional square section; therefore, the silicon ingot can be cast without increasing the depth of the interface, and the sectional area is increased by extending the length of the major side of the rectangle, whereby the manufacturing efficiency can be enhanced.

Figure 6A:
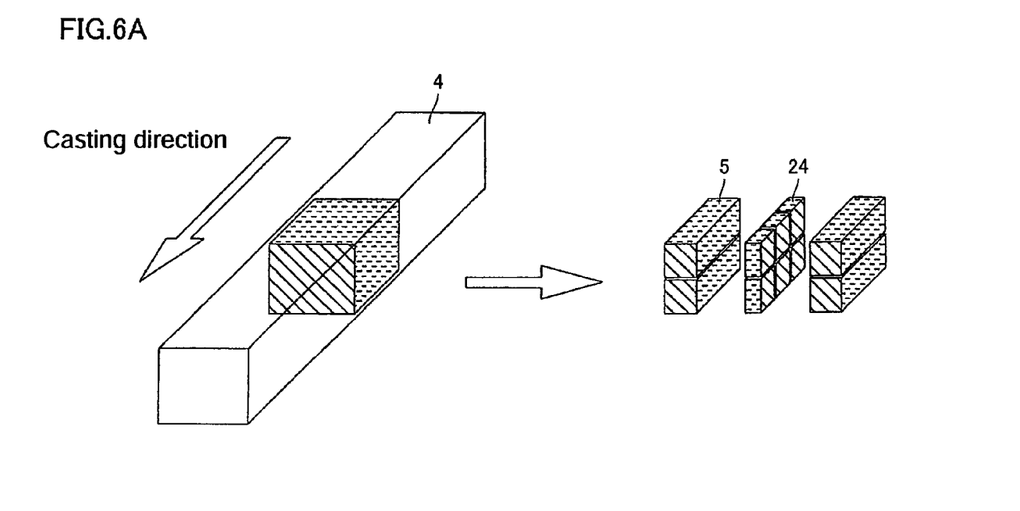
FIG. 6A is a view explaining a method for cutting out two types of silicon blocks with different dimensions respectively.
Figure 6B:
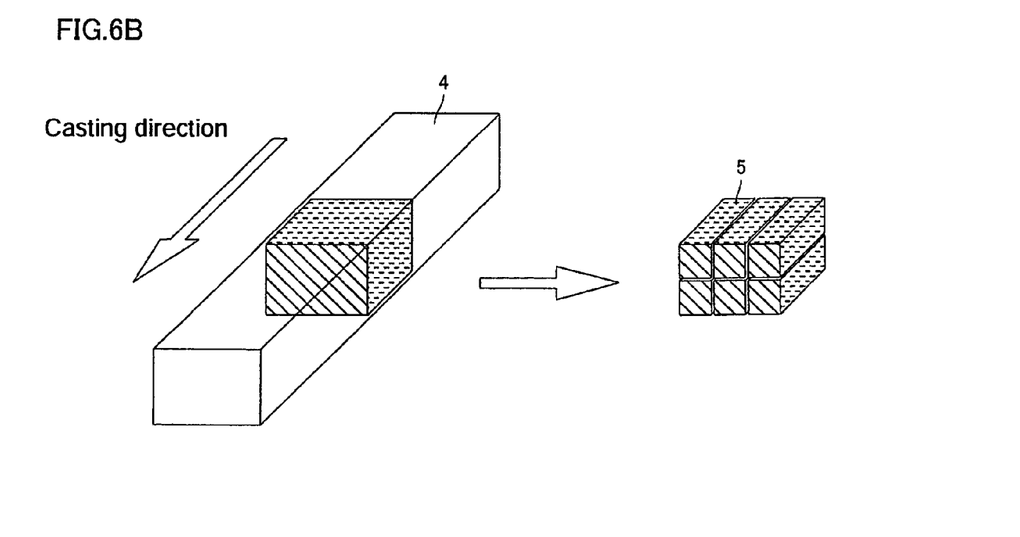
FIG. 6B is a view explaining a method for cutting out 6 pieces of equal-sized silicon blocks.

FIGS. 6A and 6B typically explain a method for cutting out silicon blocks from a cast silicon ingot by the casting method of the present invention. FIG. 6A explains a method for cutting out two types of silicon blocks with different dimensions respectively, and FIG. 6B explains a method for cutting out 6 pieces of equal-sized silicon blocks. The conventional ingot with a square section is vertically divided into two parts and is transversally divided into two parts; thereby four equal-sized silicon blocks are cut out. On the other hand, from the silicon ingot cast by the casting method according to the present invention, silicon blocks can be cut out also from an extended part 24 in the major side direction of the rectangle, as shown in FIG. 6A.

However, in view of the number of times of cutting the silicon blocks and the process of slicing the obtained silicon block, the equal-sized silicon blocks are more suitable for reducing equipment investment in terms of industrial production, in comparison to the silicon blocks with two types of different dimensions. Therefore, the major side of the silicon ingot preferably has such a dimension that 6 pieces or more of equal-sized silicon blocks can be cut out, as shown in FIG. 6B.

The inventors of the present invention examined not only the manufacturing efficiency of the ingot, but also the relationship between the cutting method of the ingot and the production yield, in view of enhancing the production yield. Specifically, assuming the cases where the numbers of silicon blocks cut out from the ingot are 4 pieces, 6 pieces, and 8 pieces, the inventors examined the production yield for each excision width, varying the excision width of the edge from 0 mm to 20 mm. Here, each cutting allowance in cutting into the silicon blocks was set to 5 mm on the assumption of the blade cutting.

Figure 7:
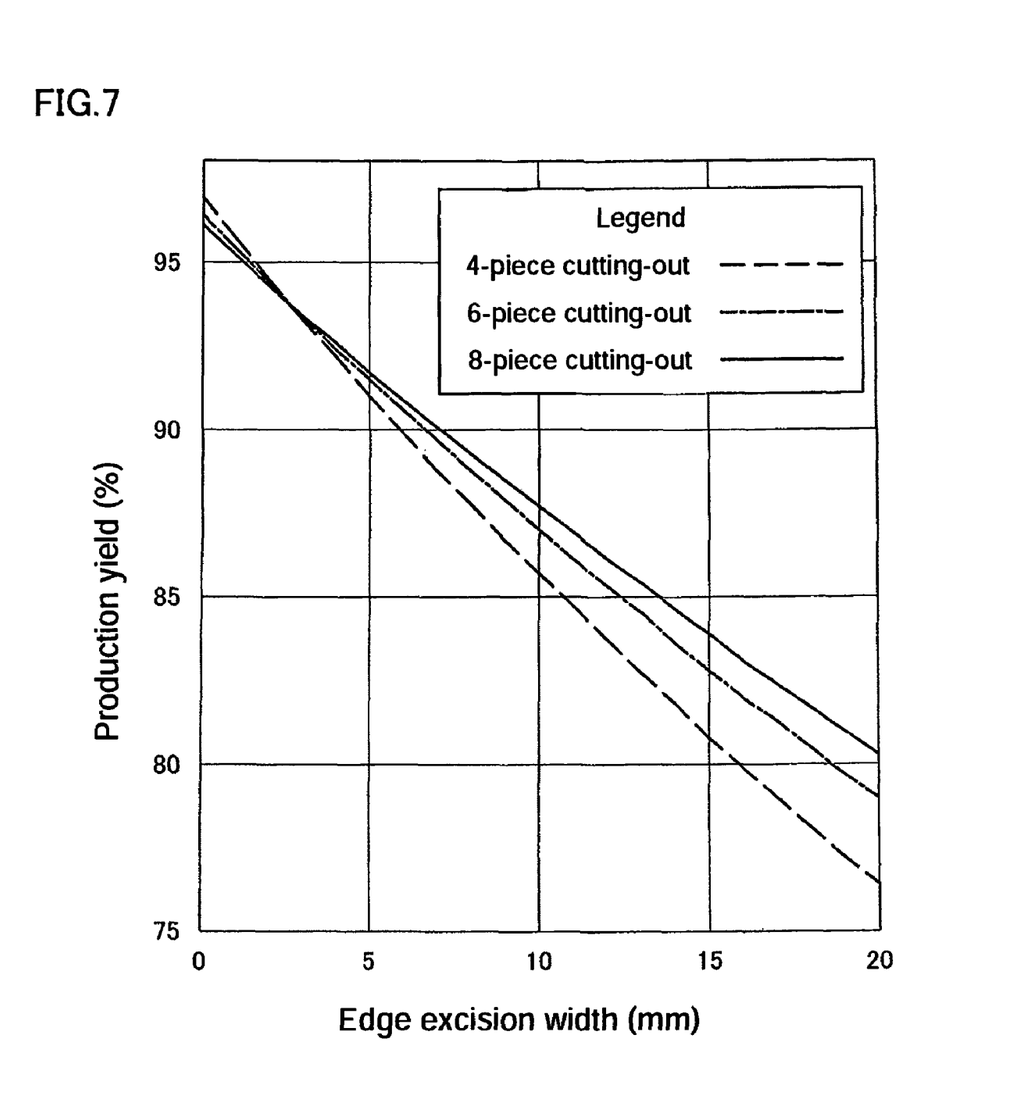
FIG. 7 is a view showing a relationship between an edge excision width and a production yield, when varying the number of equal-sized silicon blocks to be cut out from a silicon ingot of a rectangular section.

FIG. 7 shows a relationship between the edge excision width and the production yield, when varying the number of equal-sized silicon blocks cut out of a silicon ingot with a rectangular section. FIG. 7 confirmed that as the number of silicon blocks cut out of the rectangular section of the ingot is larger, the production yield becomes more enhanced in the excision width of the edge over 3 mm. Thus, increasing the sectional area of the ingot as well as increasing the number of silicon blocks cut out will enhance the manufacturing efficiency of the ingot and the production yield.

The effect of enhancing the quality inside the ingot according to the present invention will be described. As mentioned above, the chill layer having small grain size and abundant crystal defects grows on the side surface of the ingot where the solidification speed is high, and the columnar crystals with a large grain size grow inside the ingot where the solidification speed is low. In other words, the columnar crystals with a larger grain size grow in an area farther away from the side surface to be excellent semiconductor characteristics inside the ingot. Therefore, the present invention adopts the ingot with a rectangular section and increases the sectional area, to thereby increase the proportion of the area away from the side surface, and this invention reduces the influence of solidification from the side.

Figure 8A:
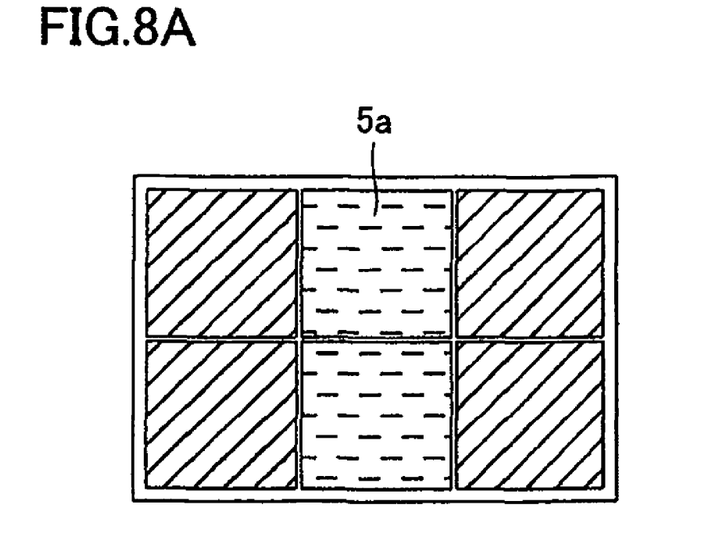
FIG. 8A is a sectional view for cutting out 6 pieces of silicon blocks.
Figure 8B:
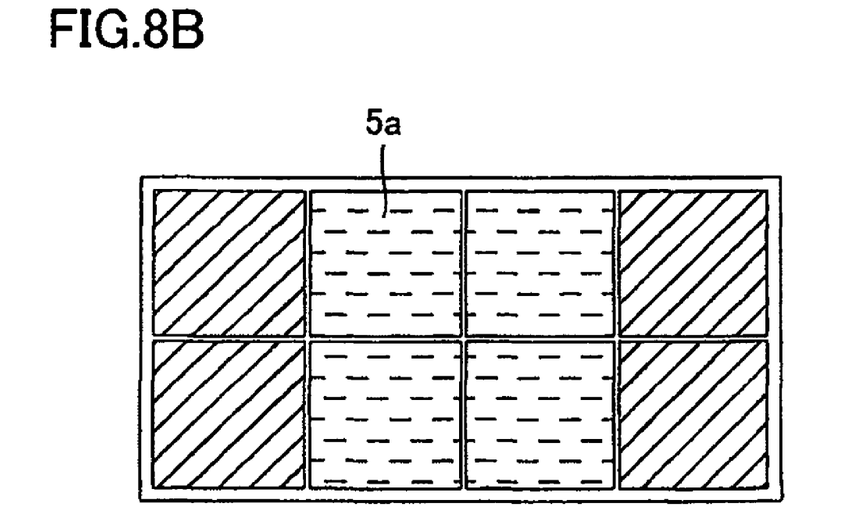
FIG. 8B is a sectional view for cutting out 8 pieces of silicon blocks.

FIGS. 8A and 8B typically show a method for cutting out equal-sized silicon blocks from a silicon ingot of a rectangular section. FIG. 8A is a sectional view for cutting out 6 pieces of silicon blocks, and FIG. 8B is a sectional view for cutting out 8 pieces of silicon blocks.

In case of cutting out 6 pieces as shown in FIG. 8A, as to the minor side direction, the distances from the side are the same as the case of conventional 4-piece cut-out silicon blocks. However, as to the major side direction, accompanied with the increase of the distance from the side, extra two pieces of silicon blocks 5a (areas indicated by broken lines in FIG. 8A) are obtained, where the influence of solidification from the side is reduced. Thus, in case of cutting out 6 pieces, the rate of crystals having a larger grain size is increased in comparison to the conventional manufacturing method; thereby, the silicon block of higher conversion efficiency can be manufactured for the solar battery.

In addition, in case of cutting out 8 pieces as shown in FIG. 8B, as to the minor side direction, the distances from the side are the same as the conventional 4-piece cut-out silicon blocks. However, as to the major side direction, accompanied with the increase of the distance from the side, extra four pieces of silicon blocks 5a (areas indicated by broken lines in FIG. 8B) are obtained, where the influence of solidification from the side is reduced. Thus, in case of cutting out 8 pieces, the rate of crystals having a larger grain size is higher than the case of cutting out 6 pieces; thereby, the silicon block of higher conversion efficiency can be manufactured for the solar battery.

In the same manner as the above, further extending the length of the major side of the rectangular section, and carrying out 10-piece cutting-out or 12-piece cutting-out will make it possible to manufacture the silicon block with high production yield and high conversion efficiency. However, the general sectional dimension of the silicon substrate these days is 150 mm~160 mm. Therefore, an excessive increase of the sectional area of the ingot will lead to the necessity of enlarging the melting coil and the cooling crucible, and also the necessity of modifying the production equipment on a large scale, in order to cope with an increased mass of the silicon ingot in transferring to subsequent processing steps. In consideration of these conditions, the number of silicon blocks to be cut-out is preferably up to 8 pieces.

EXAMPLES

In order to confirm the effects of the present invention, after manufacturing the silicon block, the inventors evaluated a manufacturing efficiency, a production yield, and a conversion efficiency as a solar battery.

The sectional dimensions of the ingot as the raw material of the silicon block are set to the following four types: (square section) 345 mm×345 mm, (rectangular sections) 345 mm×450 mm, 345 mm×506 mm, 345 mm×667 mm. In casting, an electromagnetic furnace shown in FIG. 4 is used, and an ingot of overall length 1 m is cast.

From the obtained four types of ingots, the silicon blocks of the sectional dimension 156 mm×156 mm are cut out. In any of the ingots, the width of the cutting margin between the silicon blocks is set to 5 mm, and the excision width of the edge is set to 14 mm.

In Test No. T2 of the inventive example, 4 pieces of silicon blocks of 317 mm in length are cut-out from the ingot with the sectional dimension 345 mm×450 mm, and 6 pieces of silicon blocks of 100 mm in length are also cut out from the same. In Test No. T3, 6 pieces of silicon blocks of 317 mm in length are cut out from the ingot with the sectional dimension 345 mm×506 mm. In Test No. T4, 8 pieces of silicon blocks of 317 mm in length are cut out from the ingot with the sectional dimension 345 mm×667 mm. In Test No. T1 of the comparative example, 4 pieces of silicon blocks of 317 mm in length are cut out from the ingot with a square section of the sectional dimension 345 mm×345 mm.

A plate of 2~3 mm in thickness was cut out of the square section of each of the obtained silicon blocks, and a square test piece of 15 mm in side length was sampled from each of four corners of the square plate. The surface of the test piece was polished to the thickness 300~400 μm to make a testing substrate. Thereafter, the surface was mirror-polished, and an n-layer is formed by phosphorus diffusion after chemical etching is applied, and coating of the antireflection film and bonding of the electrodes, etc. were performed to make a solar battery element.

The performance of the solar battery element was measured by using the test equipment (Model: YQ-250BX) from JASCO Inc, with the solar simulator (100 mW/cm$^2$) of AM 1.5 as the light source. The average of conversion efficiencies acquired for the four corners of the above square plate was deemed as a conversion efficiency of the square plate. Further, by using the value where the above conversion efficiency was processed as weighted average for all the square plates obtained from the silicon blocks, the conversion efficiency in each example was evaluated.

Table 1 shows the measurement result of the manufacturing efficiency and the production yield of the silicon ingot, and the conversion efficiency as the solar battery.

inside the ingot is increased so that the conversion efficiency of the solar battery using a cut-out silicon block as the substrate material can be enhanced. From these advantages, the casting method and cutting method of the silicon ingot according to the present invention can be widely applied to manufacturing the solar battery at a low cost with high quality.

What is claimed is:

1. A method for casting a silicon ingot from which silicon blocks are cut out thereafter, using a continuous casting method by means of an electromagnetic induction, comprising the steps of:
    casting the silicon ingot with a rectangular section,
    trimming each side edge of the ingot rectangular section by a predetermined thickness over 3 mm to thereby remove a chill layer, and
    cutting out the silicon blocks each of which has a square section, wherein not less than six pieces of equal-sized silicon blocks are cut out from the silicon ingot and minor sides of said rectangular section are bisected and major sides thereof are at least trisected.

2. The method for casting a silicon ingot according to claim 1, further comprising the step of slicing cut-out silicon blocks so as to obtain a substrate for a solar battery.

3. A method for cutting silicon blocks in which a silicon ingot cast by using a continuous casting method by means of an electromagnetic induction is deemed as a starting material, comprising the steps of:
    casting the silicon ingot with a rectangular section,

TABLE 1

| Classification | Test No. | Sectional dimension of silicon ingot (mm) | | Length and number of silicon blocks | | Casting speed (mm/min) | Manufacturing efficiency (casting amount per unit time) (kg/hr) | Production yield (%) | Conversion efficiency (%) |
|---|---|---|---|---|---|---|---|---|---|
| | | Vertical | Transverse | Length (mm) | Number | | | | |
| Comparative example | T1 | 345 | 345 | 317 | 4 | 1.3 | 21.6 | 81.8 | 14.70 |
| Inventive example | T2 | 345 | 450 | 317 100 | 4 6 | 1.3 | 28.2 | 82.5 | 14.75 |
| | T3 | 345 | 506 | 317 | 6 | 1.3 | 31.7 | 83.6 | 14.77 |
| | T4 | 345 | 667 | 317 | 8 | 1.3 | 41.8 | 84.6 | 14.80 |

As shown in Table 1, the silicon ingot of the inventive example is superior to the silicon ingot of the comparative example in all aspects of the manufacturing efficiency, the production yield, and the conversion efficiency as the solar battery. Especially, the manufacturing efficiency was confirmed to be greatly enhanced in comparison to the silicon ingot of the comparative example.

According to the casting method of the silicon ingot of the present invention, in comparison to the conventional casting method of the ingot, the manufacturing efficiency can be enhanced to a great extent, since the ingot with the increased sectional area is manufactured while maintaining a similar casting speed.

According to the cutting method of the silicon ingot of the present invention, the sectional area of the ingot is increased, and the number of silicon blocks to be cut out is increased, whereby the amount of excision of the edge per silicon block is decreased so that the production yield can be enhanced.

Further, the sectional shape of the cast ingot is made rectangular, and the sectional area is increased, whereby the proportion of columnar crystals having a large grain size trimming each side edge of the ingot rectangular section by a predetermined thickness over 3 mm to thereby remove a chill layer, and
    cutting out the silicon blocks, each of which has a square section, from the obtained silicon ingot as the starting material, wherein not less than six pieces of equal-sized silicon blocks are cut out from the silicon ingot and minor sides of said rectangular section are bisected and major sides thereof are at least trisected.

4. The method for cutting a silicon ingot according to claim 3, wherein eight pieces of silicon blocks are cut out from the silicon ingot, while quadrisecting major sides of said ingot rectangular section.

5. The method for cutting a silicon ingot according to claim 3, further comprising the step of slicing cut-out silicon blocks so as to obtain a substrate for a solar battery.

6. The method for cutting a silicon ingot according to claim 4, further comprising the step of slicing cut-out silicon blocks so as to obtain a substrate for a solar battery.

* * * * *